US009362942B1

(12) United States Patent
Hammler

(10) Patent No.: US 9,362,942 B1
(45) Date of Patent: Jun. 7, 2016

(54) SYSTEM CHARACTERISTIC IDENTIFICATION SYSTEMS AND METHODS

(71) Applicant: Maxim Integrated Products, Inc., San Jose, CA (US)

(72) Inventor: Nikolaus Hammler, Stanford, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/739,069

(22) Filed: Jun. 15, 2015

Related U.S. Application Data

(60) Provisional application No. 62/102,189, filed on Jan. 12, 2015.

(51) Int. Cl.
*H04B 1/62* (2006.01)
*H03M 1/66* (2006.01)

(52) U.S. Cl.
CPC .. *H03M 1/66* (2013.01); *H04B 1/62* (2013.01)

(58) Field of Classification Search
CPC ... H03F 1/3247; H03F 3/24; H03F 2200/336; H03F 2201/3233; H03F 3/189; H03F 1/32; H03M 13/256; H03M 13/41; H03M 13/39; H03M 13/4169; H03M 13/6343
USPC .......... 375/297, 261, 298; 341/110, 139, 140, 341/144
See application file for complete search history.

(56) References Cited

U.S. PATENT DOCUMENTS

| 6,549,067 | B1 * | 4/2003 | Kenington | H03F 1/3247 330/149 |
| 6,583,739 | B1 * | 6/2003 | Kenington | H03F 1/3229 330/149 |
| 6,774,834 | B2 * | 8/2004 | Dartois | H03F 1/3294 341/118 |
| 7,020,447 | B2 * | 3/2006 | Nagatani | H03F 1/3247 375/297 |
| 7,058,369 | B1 * | 6/2006 | Wright | H01Q 1/243 375/297 |
| 7,944,984 | B1 * | 5/2011 | Wu | H04L 27/364 375/261 |
| 8,576,944 | B2 * | 11/2013 | Chen | H04L 27/2614 327/291 |

(Continued)

FOREIGN PATENT DOCUMENTS

DE     102013113528 A1     6/2014

OTHER PUBLICATIONS

Hammler, N., Eldar, Y., & Murmann, B. (2014). Low-Rate Identification of Memory Polynomials. 2014 *IEEE International Symposium on Circuits and Systems (ISCAS)* (pp. 1034-1037). Melbourne: IEEE.

(Continued)

*Primary Examiner* — Linh Nguyen

(57) ABSTRACT

A digital to analog converter samples a first digital signal to produce first digital values and that outputs a first analog signal corresponding to the first digital values to a system. A mixer mixes a second analog signal output by the system in response to the first analog signal with a periodic signal to produce a mixed signal. An integrator integrates the mixed signal and generates an integrator signal based on the integration. An analog to digital converter converts samples of the integrator signal into second digital values. A correction module generates third digital values based on the first digital values and corrections for the integrator and the DAC. A correction determination module determines coefficients based on pairs of ones of the third digital values and ones of the second digital values. A pre-distortion module pre-distorts a second digital signal based on the coefficients to produce the first digital signal.

20 Claims, 6 Drawing Sheets

(56) References Cited

U.S. PATENT DOCUMENTS

| | | | | |
|---|---|---|---|---|
| 8,787,494 B2* | 7/2014 | Bai | H03F 1/3258 |
| | | | 327/291 |
| 2002/0012404 A1* | 1/2002 | Ahn | H03F 1/3229 |
| | | | 375/297 |
| 2006/0038710 A1* | 2/2006 | Staszewski | H03F 3/24 |
| | | | 341/143 |
| 2008/0152037 A1* | 6/2008 | Kim | H03F 1/3247 |
| | | | 375/297 |
| 2012/0200435 A1* | 8/2012 | Ngo | H03M 7/3082 |
| | | | 341/61 |
| 2014/0161207 A1 | 6/2014 | Teterwak | |

OTHER PUBLICATIONS

Joshi, S., & Boyd, S. (2009). Sensor Selection via Convex Optimization. *IEEE Transactions on Signal Processing*, 451-462.

Vetterli, M., Marziliano, P., & Blu, T. (2002). Sampling Signals With Finite Rate of Innovation. *IEEE Transactions on Signal Processing*, 1417-1428.

* cited by examiner

SYSTEM CHARACTERISTIC IDENTIFICATION SYSTEMS AND METHODS

CROSS-REFERENCE TO RELATED APPLICATIONS

This application claims the benefit of U.S. Provisional Application No. 62/102,189, filed on Jan. 12, 2015. The entire disclosure of the application referenced above is incorporated herein by reference.

FIELD

The present disclosure relates to systems and methods for identifying characteristics of systems and more particularly relates to systems and methods for pre-distorting inputs for non-linear power amplifiers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Analog-to-digital converters (ADCs) convert samples of an analog input signal into digital values corresponding to the samples. Various types of ADCs are available, such as successive-approximation-register (SAR) ADCs, Delta-Sigma ($\Delta\Sigma$) ADCs, and pipelined ADCs. ADCs may be used in various electronic devices, such as finite impulse resolution (FIR) digital to analog converters (DACs) and many other types of electronic devices.

Digital-to-analog converters (DAC) convert digital inputs into analog outputs. DACs are also used in various types of electronic devices. For example, a DAC may be used in the transmit portion of a wireless transceiver and other types of electronic devices.

SUMMARY

In a feature, a characteristic identification system is described. A digital to analog converter (DAC) samples a first digital signal at a first predetermined rate to produce first digital values and that outputs a first analog signal corresponding to the first digital values to a system of one or more components that is to be characterized. A mixer receives a second analog signal output by the system in response to the first analog signal and mixes the second analog signal with a periodic signal to produce a mixed signal. An integrator integrates the mixed signal during successive predetermined periods and generates an integrator signal based on the integration. An analog to digital converter (ADC) samples the integrator signal at a second predetermined rate corresponding to the predetermined periods and converts the samples into second digital values. The second predetermined rate is less than the first predetermined rate. A correction module determines corrections for the integrator and the DAC and generates third digital values based on the first digital values and the corrections, respectively. A correction determination module pairs ones of the third digital values with ones of the second digital values, respectively, and determines coefficients for the system based on the pairs. A pre-distortion module pre-distorts a second digital signal based on the coefficients for the system to produce the first digital signal.

In further features, the mixer multiplies the second analog signal with the periodic signal to produce the mixed signal.

In further features, the correction determination module determines the coefficients for the system based on the pairs using least squares (LS).

In further features, a signal generator module selectively varies a frequency of the periodic signal.

In further features, the signal generator module varies the frequency of the periodic signal within each of the predetermined periods.

In further features, the signal generator module varies the frequency of the periodic signal randomly.

In further features, the signal generator module varies the frequency of the periodic signal based on the first digital values.

In further features, the system includes a non-linear power amplifier.

In further features, a wireless transmitter includes the characteristic identification system of claim 1, and the system includes a non-linear power amplifier. The wireless transmitter also includes the non-linear power amplifier and an antenna. The non-linear power amplifier amplifies the first analog signal to produce a third analog signal and applies the third analog signal to the antenna.

In further features, the correction module determines the corrections for the integrator and the DAC based on characteristics of the periodic signal, respectively.

In a feature, a method of characterizing a system of one or more components is described. The method includes: using a digital to analog converter (DAC), sampling a first digital signal at a first predetermined rate to produce first digital values and outputting a first analog signal corresponding to the first digital values to the system of one or more components that is to be characterized; using a mixer, receiving a second analog signal output by the system in response to the first analog signal and mixing the second analog signal with a periodic signal to produce a mixed signal; integrating the mixed signal during successive predetermined periods and generating generates an integrator signal based on the integrating; using an analog to digital converter (ADC), sampling the integrator signal at a second predetermined rate corresponding to the predetermined periods and converting the samples into second digital values; determining corrections for the integrator and the DAC; generating third digital values based on the first digital values and the corrections, respectively; pairing ones of the third digital values with ones of the second digital values, respectively; determining coefficients for the system based on the pairs; and pre-distorting a second digital signal based on the coefficients for the system to produce the first digital signal. The second predetermined rate is less than the first predetermined rate.

In further features, the mixing includes multiplying the second analog signal with the periodic signal to produce the mixed signal.

In further features, determining the coefficients includes determining the coefficients for the system based on the pairs using least squares (LS).

In further features, the method further includes selectively varying a frequency of the periodic signal.

In further features, the method further includes varying the frequency of the periodic signal within each of the predetermined periods.

In further features, the method further includes varying the frequency of the periodic signal randomly.

In further features, the method further includes varying the frequency of the periodic signal based on the first digital values.

In further features, the system includes a non-linear power amplifier.

In further features, the system includes a non-linear power amplifier that amplifies the first analog signal to produce a third analog signal and applies the third analog signal to an antenna of a wireless transceiver.

In further features, the method further includes determining the corrections for the integrator and the DAC based on characteristics of the periodic signal, respectively.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
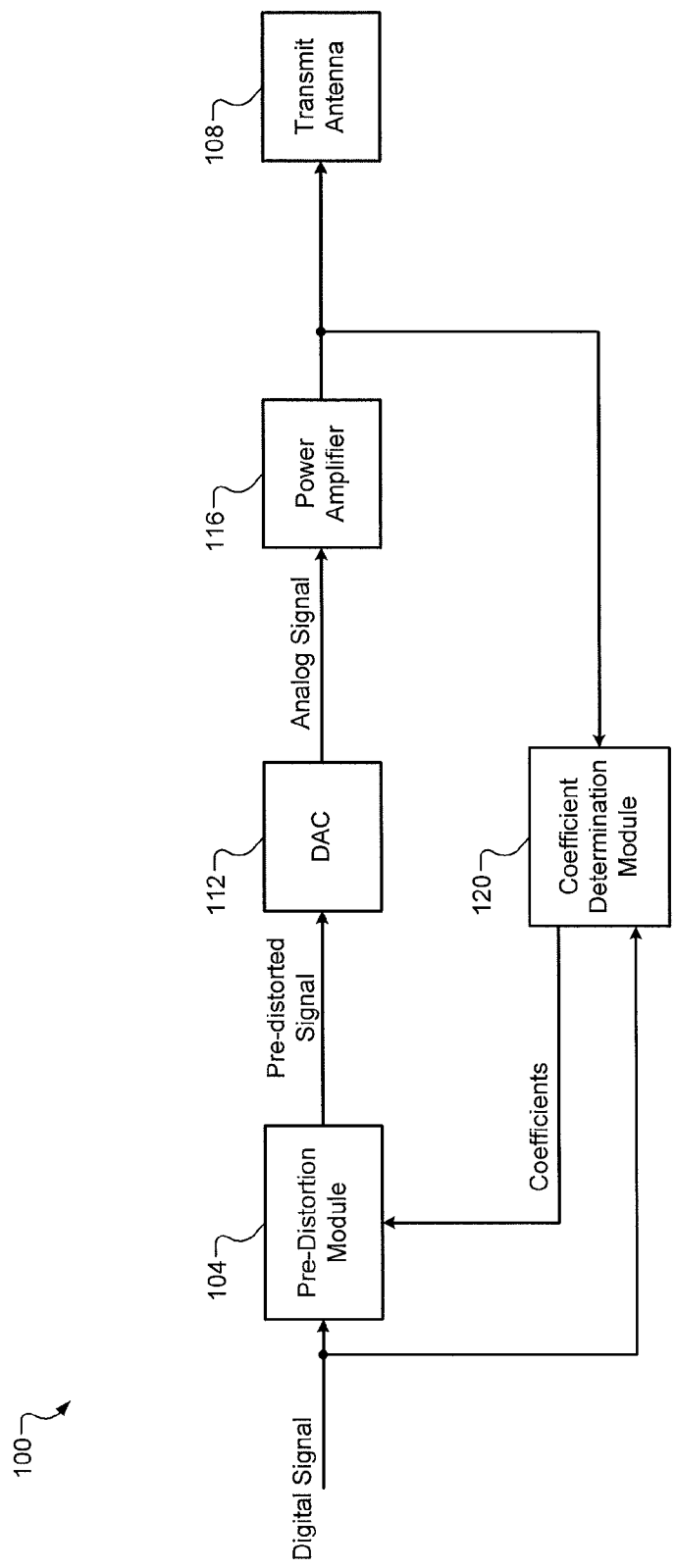
FIG. 1 is a functional block diagram of an example portion of a wireless transceiver.

FIG. 1 includes a functional block diagram of an example transmit portion of a wireless transceiver 100. A pre-distortion module 104 receives a digital signal that is to be wirelessly transmitted by one or more transmit antennas, such as transmit antenna 108. The pre-distortion module 104 distorts the digital signal to produce a pre-distorted signal.

A digital to analog converter (DAC) 112 converts the (digital) pre-distorted signal into an analog signal and outputs the analog signal to a power amplifier 116. The power amplifier 116 amplifies the analog signal and applies the amplified analog signal to the transmit antenna 108 to perform wireless communication. For example only, the wireless communication may be according to an IEEE 802.11 communication standard or another wireless communication standard.

A coefficient determination module 120 determines one or more coefficients for use by the pre-distortion module 104 based on pairs of: digital inputs; and the respective amplified analog signals generated by the power amplifier 116 based on those digital inputs. The pre-distortion module 104 distorts the digital signal based on the coefficient(s) to produce the pre-distorted signal.

Figure 2:
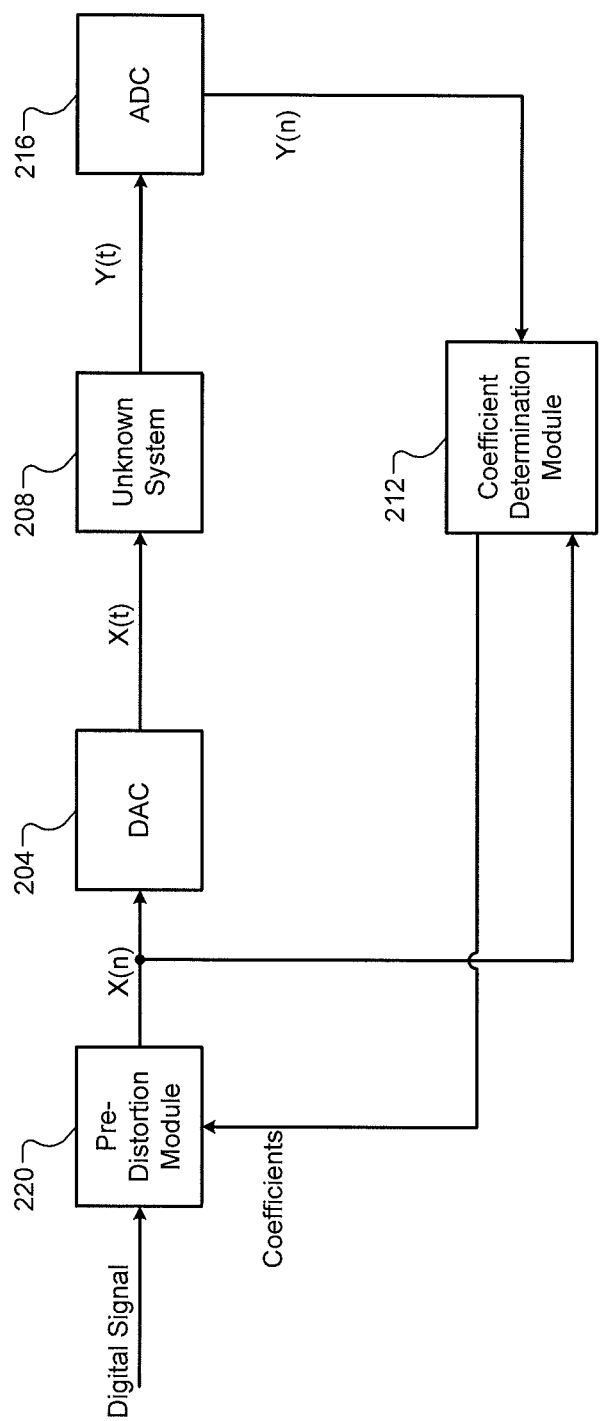
FIGS. 2-3 are functional block diagrams of example characteristic identification systems.

FIG. 2 is a functional block diagram of a characteristic identification system. A digital input signal x(n) is input to a DAC 204. The DAC 204 samples the digital input signal at a predetermined sampling rate ($f_S$), converts the samples to an analog signal x(t), and outputs the analog signal to an unknown system 208, such as a non-linear, frequency dependent power amplifier (e.g., the power amplifier 116 of the wireless transceiver) and/or one or more other components. The digital input signal is also processed at the predetermined sampling rate ($f_S$) by a coefficient determination module 212.

The predetermined sampling rate ($f_S$) indicates sampling is performed every predetermined period ($T_S$) and corresponds to the Nyquist rate ($f_S$) of the system. Unknown systems may include systems for which coefficients representing characteristics of the systems are unknown.

The unknown system 208 outputs an analog signal y(t) to an ADC 216. The ADC 216 samples the analog signal y(t) at the predetermined sampling rate ($f_S$) and converts the samples into digital values y(n). The coefficient determination module 212 pairs the samples of the digital input signal x(n) with the resulting digital samples y(n) output by the ADC 216.

Generally, the unknown system 208 can be described by a Volterra series. For purposes of simplicity, the reminder uses memory polynomial, a truncated version of the Volterra Series:

$$y[n] = \sum_{p=1}^{P} \sum_{q=0}^{Q} c_{pq} f_p(x[n-q]) \quad \text{Eq 1}$$

where $f_p(\bullet)$ describes a non-linear, non-frequency dependent, memory less mapping (e.g., $f_p(x)=x^p$), and $c_{pq}$ represents coefficients representing characteristics of the unknown system 208. P is a maximum non-linearity order, and Q is a memory depth. The coefficient determination module 212 determines $c_{pq}$ coefficients for the unknown system 208 based on N pairs of the samples of: the digital input signal x(n); and the resulting digital samples y(n). N is an integer greater than P*(Q+1). As N increases, the accuracy of the $c_{pq}$ coefficients increases, but a time necessary to determine the $c_{pq}$ coefficients also increases.

A pre-distortion module 220 pre-distorts a digital input signal based on the $c_{pq}$ coefficients to produce the digital input signal x(n). The pre-distortion module 220 may set the digital input signal x(n) to the digital input signal while the N different pairs of the samples are collected.

This approach, however, requires that the predetermined sampling rate be relatively high (to ensure that the N pairs can be obtained and the coefficients can be determined within a predetermined period). The input bandwidth of the ADC 216 also needs to be relatively high. As such, the ADC 216 may be costly. In the case of non-linear systems, the cost may be even greater since the output bandwidth needs to be larger by the order of the non-linearity. Aliasing may be used to reduce the sampling rate of the ADC 216 in various implementations.

Figure 3:
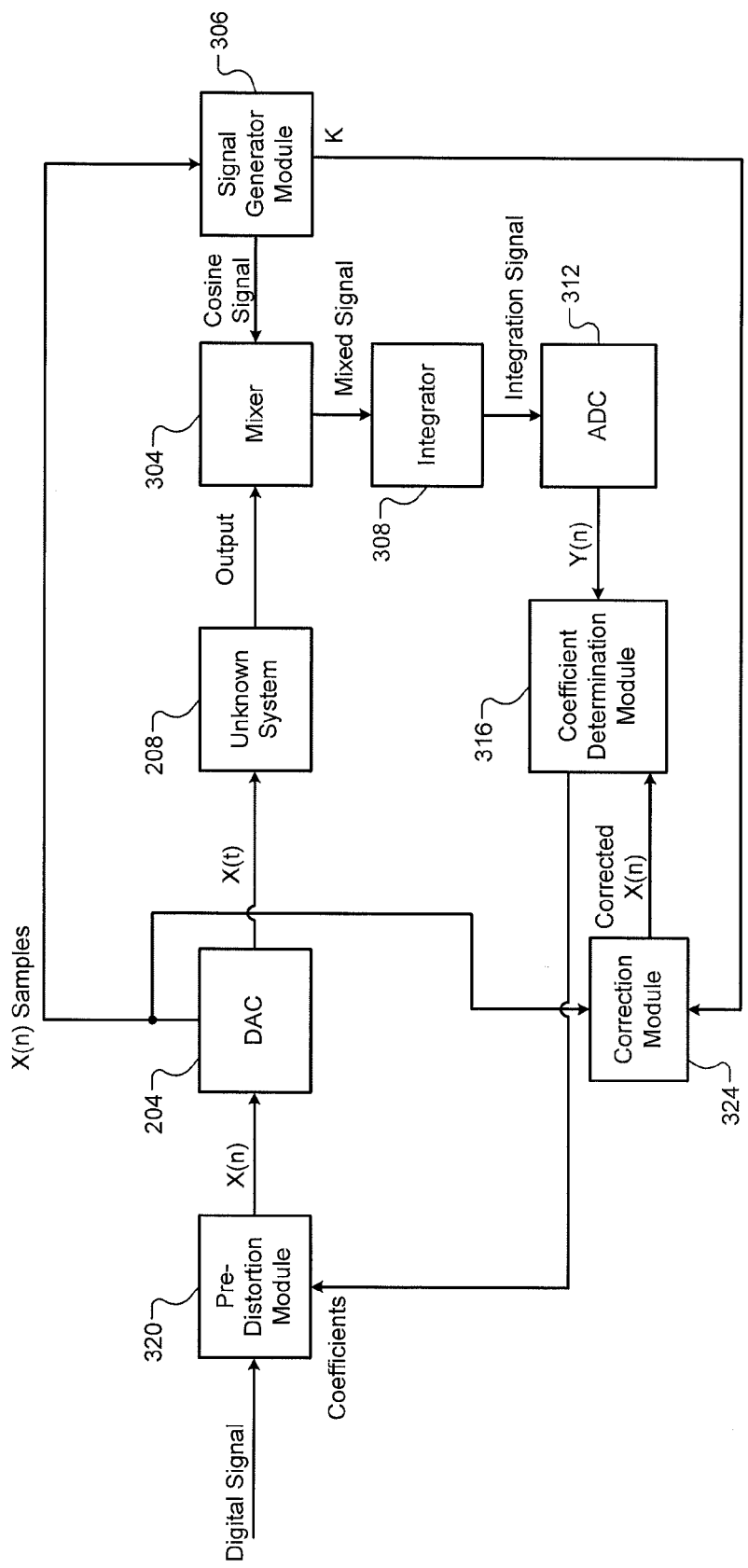

Referring now to FIG. 3, a functional block diagram of a characteristic identification system is presented. As in FIG. 2, a digital input signal x(n) is input to the DAC 204. The DAC 204 samples the digital input signal at the predetermined sampling rate ($f_S$), converts the samples to an analog signal x(t), and outputs the analog signal to the unknown system 208, such as a non-linear, frequency dependent power amplifier (e.g., the power amplifier 116 of the wireless transceiver). In various implementations, the analog signal may be upconverted before being input to the unknown system 208.

The unknown system 208 outputs the analog signal y(t) to a mixer 304. The mixer 304 mixes the output y(t) of the unknown system 208 with a time-varying periodic signal to produce a mixed signal. The mixer 304 may, for example, multiply the output y(t) of the unknown system 208 with a time-varying periodic signal to produce the mixed signal. As illustrated in FIG. 3, time-varying periodic signal may be a complex exponential wave expressed as:

$$\exp\left(\frac{2\pi}{To}kt\right),$$

where exp represents the exponential function, To is an observation period and corresponds to a second predetermined sampling rate $f_0$ ($f_0=1/To=fs/N_0$), t indicates time, and k is a value that changes each observation period (To). While the example of an exponential signal is provided, the time-varying periodic signal that is mixed with the output y(t) of the unknown system 208 may be another suitable type of time-varying periodic or non-periodic signal. For example, a sine wave, a cosine wave, a square wave, or another suitable type of periodic or non-periodic signal may be used. For simplicity of explanation, however, examples described herein are in terms of periodic signals of the frequency k. The second predetermined sampling rate ($f_0$) is less than the predetermined sampling rate fs.

A signal generator module 306 generates the time-varying periodic signal input to the mixer 304. The signal generator module 306 also determines the k value for each observation period. The signal generator module 306 may determine the k value randomly for each observation period (To) or, for example, based on the samples of the digital input signal taken by the DAC 204 to increase estimation performance.

The time-varying periodic signal can be represented as $$e^{-j\frac{2\pi}{T_0}kt},$$

where the signal generator module 306 sets k to a different value for each observation period $T_0$, thereby increasing estimation performance. Using a different k maximizes the probability of obtaining independent measurements. k can be determined using optimization algorithms using the known x[n], using heuristics based on inverse sampling of a probability density distribution, and/or in another suitable manner.

An integrator 308 integrates the mixed signal during each observation period (To). The integrator 308 produces an integration signal based on the integration of the mixed signal. The integration signal can be represented as:

$$i(t) = \int_{(n-1)To}^{n(To)} m(t)\,dt,$$

where i(t) is the integration signal at a given time and m(t) represents the mixed signal at the time. The integrator 308 compresses the information obtained within each observation period to a single piece of information. The input bandwidth requirements for ADC 312 are therefore decreased. The cost of ADCs may increase as input bandwidth increases, and vice versa.

The ADC 312 samples the integration signal i(t) at the second predetermined sampling rate ($f_o$) and converts the samples into digital values y(I). I denotes the observation window. As the second predetermined sampling rate ($f_o$) is less than the predetermined sampling rate fs, the ADC 312 may cost less than the ADC 216.

A coefficient determination module 316 pairs the samples of the digital input signal x(n) with the respective resulting digital samples y(I) output by the ADC 312. The coefficient determination module 316 determines the $c_{pq}$ coefficients for the unknown system 208 based on M pairs of the samples. M is an integer greater than P*(Q+1). As M increases, the accuracy of the $c_{pq}$ coefficients increases, but a time necessary to determine the $c_{pq}$ coefficients also increases. The coefficient determination module 316 may determine the $c_{pq}$ coefficients, for example, using least squares (LS) based on the pairs.

A pre-distortion module 320 pre-distorts a digital input signal based on the $c_{pq}$ coefficients to produce the digital input signal x(n). The pre-distortion module 320 outputs the digital input signal x(n) to the DAC 204. The pre-distortion module 320 may set the digital input signal x(n) to the digital input signal while the M pairs of the samples are collected.

The approach employed with the example of FIG. 3 can be viewed as obtaining one Fourier coefficient per observation period (To). By selecting the Fourier coefficients (i.e., the frequency of the sinusoids) in a specific way (e.g., randomly, and non-linearly), the information content of the measurement pairs can be best maximized for the determination of the $c_{pq}$ coefficients. Making the pairs as different as possible from previous pairs may increase accuracy of the determined $c_{pq}$ coefficients. The randomness may make the pairs as different as possible and may be provided by setting the values of k randomly for each observation period (To).

The determination of the $c_{pq}$ coefficients for a power amplifier having 7-th order non-linearity will be discussed as an example assuming an input signal of 20 megahertz (MHz) bandwidth. In the example of FIG. 2, the predetermined sampling rate used by the ADC 216 would have to be approximately 150 MHz for proper sampling. Assuming that at least 3000 pairs of samples (i.e., N=3000) are used to achieve a certain accuracy of the $c_{pq}$ coefficients, the $c_{pq}$ coefficients would be determined after approximately 20 microseconds.

In the example of FIG. 3, a sub-Nyquist factor of 100 could be used, which means that the second predetermined sampling rate could be 1.5 MHz. With the use of the integrator 308, a lesser number of samples may be used. For example, if 100 samples provide the same accuracy in the $c_{pq}$ coefficients, the $c_{pq}$ coefficients would be determined after approximately 66.67 microseconds. If the same number of pairs of samples were used (i.e., M=N), the example of FIG. 3 would require more time to determine the $c_{pq}$ coefficients.

In various implementations, multiple branches for the mixer, the integrator, and the ADC, for example, similar to a direct conversion I/Q receiver, may be implemented to decrease the time necessary to determine the $c_{pq}$ coefficients. More specifically, multiple branches (including the mixer, integrator, and ADC) may be implemented to obtain multiple measurements during each observation period To.

Consider signals having the period $T_0$ of the form:

$$x(t)=\Sigma_{n=-\infty}^{\infty}\Sigma_{q=0}^{Q}c_q\delta(t-t_q-nT_0).$$

Despite the high bandwidth due to the Diracs, the signal can be described by 2(Q+1) degrees of freedom. Therefore, the signal can be sampled at a rate proportional to $2(Q+1)/T_0$, which is independent of the Nyquist rate. If the time delays $t_q$ are known, the model is linear in its unknown parameters $c_q$. Therefore, a number of measurements related to the number of unknowns suffice to solve for the unknown parameters $c_q$ via least squares (LS). The impulse response of a linear system can be interpreted to have the form:

$$h(t) = \sum_{q=0}^{Q} c_q h(t - t_q), \quad t_q \approx qT_s \qquad \text{Eq 1}$$

which can also be extended to the general memory polynomial model (Eq 1) or the full Volterra series.

Here, however, the interest is not to reconstruct the output signal y[l] but to estimate the system parameters (the $c_{pq}$ coefficients) which are linear for any set of input/output measurements. This is independent of the Nyquist rate. To solve the unknown system 208 via least squares, the system may be well conditioned. This condition may be satisfied when enough samples are taken at the Nyquist rate.

On the other hand, much fewer measurements can suffice to provide a lesser accuracy when the measurement pairs are as orthogonal as possible (i.e., each new measurement adds non-redundant information). In time domain, the samples y[n] and y[n+1] are similar and therefore add redundant information.

Equation 1 (Eq 1) could be transformed to frequency domain and re-written as:

$$Y(\omega) = \sum_{p=1}^{P} \sum_{q=0}^{Q} c_{pq} F_p(X(\omega)) e^{-j\omega q} \qquad \text{Eq 2}$$

where $$\omega = \frac{2\pi}{N} k$$

for the case of a periodic input signal. A number of Y(ω) and X(ω) pairs proportional to P(Q+1) (degrees of freedom) could be used to find the $c_{pq}$ coefficients. Doing this randomly across k (or according to some probability distribution functions) gives good results and can require about one order of magnitude or less measurements to achieve a certain accuracy. The set of Y(ω) is obtained via analog mixing and integration according to FIG. 3. X(ω) is known since x(n) is known. $F_p(X(\omega))$ is calculated by performing a discrete-time sum over the samples as will be described later.

When the input signal is strictly periodic with $T_0 = N_0 T_s$, the Fourier series coefficients obtained in analog domain match those obtained in digital domain (DFT coefficients of the corresponding digital signal):

$$Y_k \cdot N_0 = \sum_{p=1}^{P} \sum_{q=0}^{Q} c_{pq} X_p[k] e^{-i\frac{2\pi}{N_0} kq} \qquad \text{Eq 3}$$

where $Y_k$ denotes the k-th continuous time Fourier series coefficient and $X_p[k]$ denotes the Discrete Fourier Transform (DFT) of $f_p(x[n])$. With a sufficient oversampling ratio, the sum approximates the analog integration for both periodic and non-periodic signals sufficiently in the Riemann sense. A correction for the memory terms may be used to match cyclic convolution with linear convolution. This is because for low bandwidth (compared to the Nyquist rate) the difference between individual samples is low and the interpolation kernel can be suitably localized.

For arbitrary input signals, the interpolation kernel smears out information between samples (in the case of $$= \frac{f_s}{2},$$

the kernel is sinc(t) and extends to infinity). In this case, another correction can be applied which will be called continuous-time integration discrete-time Fourier transform (CI-DFT), which can be defined as:

$$X[k] = \sum_{n=-N_g}^{N_0+N_g} x[n] e^{-j\frac{2\pi}{N_0} kn} I_0(k, n) \qquad \text{Eq 4}$$

which is similar as the DFT with the difference that it includes guard samples $N_g$ in the summation as well as a correction factor $I_0(k,n)$ for the DAC 204 and the integrator 308. The correction factor accounts for the difference between continuous-time integration and discrete-time summation and has the general form:

$$I_0(k, n) = \int_{-n}^{N_0 - n} g_0(t) e^{-j\frac{2\pi}{N_0} kt} dt \qquad \text{Eq 5}$$

where $g_0(t)$ denotes the normalized interpolation kernel. The values of $I_O$ for different k values can be found analytically for different interpolation kernels or practical DAC responses (e.g., employing Zero-Order-Hold, followed by a reconstruction filter) during development. $N_g$ can be from around 5 to 20, depending on the properties of the reconstruction filter (and hence, image rejection of the DAC). The values of $I_O$ determined during development can be used to correct the samples of the digital input x(n) that are used by the coefficient determination module 316 to determine the $c_{pq}$ coefficients.

In other words, for the purposes of the determination of the $c_{pq}$ coefficients, the effect of the DAC 204 and the integrator 308 on the output samples y(I) should be accounted for. A correction module 324 corrects the input samples x(n) based on their effects. For each input sample, the correction module 324 determines a correction value (Io) based on the k value used during that sample's observation period (To). The correction module 324 may determine the correction value for an input sample, for example, using one of a function and a mapping that relates k values to correction values (Io).

The correction module 324 adjusts (e.g., increases, decreases) the input samples based on the samples' correction values, respectively, and inputs corrected input samples (corrected x(n)) to the coefficient determination module 316. The corrected input samples are paired with the respective output samples (y(I)), and M pairs of: corrected input samples; and the respective output samples are used to determine the $c_{pq}$ coefficients. Once determined, as described above, the $c_{pq}$ coefficients are used by the pre-distortion module 320 to apply pre-distortion.

Implementing an ideal integrator may be difficult using hardware. One artifact is the finite direct current (DC) gain, which can be described as a first-order system with a pole at $\omega_1$. $\omega_1$ may be at least 100-1000 times lower than $2\pi/T_0$ which may limit practicality. Non-idealities can be added to the model as well so that for a first-order system, and equation 6 (Eq 6) can be modified to:

$$I_0(k, n) = e^{\omega_1 n T_s} \int_{-n}^{N_0-n} g_0(t) e^{-j\frac{2\pi}{N_0}kt} e^{\omega_1 T_s t} dt \qquad \text{Eq 6}$$

While in theory, an arbitrary linear system can be chosen in place of the integrator, the objective is to pick up information over the entire temporal range of $T_0$, so the system should act similarly as an integrator. With this correction in place, the first-order pole of the integrator can be placed as high as $$\omega_1 \approx 3\frac{2\pi}{T_0}.$$

The correction can be a weighted sum and for $f_0 < 2\pi\omega_1$, the weights become nearly zero and therefore effectively decrease the observation period $T_0$.

A sinc interpolated pulse stream, spaced $T_s$ apart, is equivalent to its discrete-time samples x[n] due to the Whittaker-Kotelnikov-Shannon (WKS) theorem:

$$x(t) = \sum_{n=-\infty}^{\infty} x[n]\operatorname{sinc}(t/T_s - n) \qquad \text{Eq 7}$$

The memory polynomial of Equation 1 (Eq 1) can therefore be written in the continuous-time domain as:

$$y(t) = \sum_{p=1}^{P} \sum_{q=0}^{Q} c_{pq} f_p(x(t - qT_s)) \qquad \text{Eq 8}$$

which can be rewritten as:

$$y(t) = \sum_{p,q} c_{pq} f_p\left(\sum_{n=\infty}^{\infty} x[n]\operatorname{sinc}\left(\frac{t - qT_s}{T_s} - n\right)\right) \qquad \text{Eq 9}$$

$$= \sum_{p,q} c_{pq} f_p\left(\sum_{n=\infty}^{\infty} x[n-q]\operatorname{sinc}(t/T_s - n)\right)$$

$$= \sum_{p,q} c_{pq} \sum_{n=-\infty}^{\infty} f_p(x[n-q])\operatorname{sinc}(t/T_s - n)$$

Here, the second line follows from substitution within an infinite sum, and the last line follows from the definition of the WKS theorem.

The operation of the ideal mixer can then be added, followed by the analog integration over one interval $T_0$:

$$\int_0^{T_0} y(t) e^{-j\frac{2\pi}{T_0}t} dt = \qquad \text{Eq 10}$$

$$\int_0^{T_0} \sum_{p,q} c_{pq} \sum_{n=-\infty}^{\infty} f_p(x[n-q])\operatorname{sinc}\left(\frac{t}{T_s} - n\right) e^{-j\frac{2\pi}{T_0}t} dt =$$

$$\sum_{p,q} c_{pq} \sum_{n=-\infty}^{\infty} f_p(x[n-q]) \int_0^{T_0} \operatorname{sinc}\left(\frac{t}{T_s} - n\right) e^{-j\frac{2\pi}{T_0}t} dt$$

Substituting $$\tau = \frac{t}{T_s} - n,$$

the integral expression can be written as:

$$\int_0^{T_0} \operatorname{sinc}\left(\frac{t}{T_s} - n\right) e^{-j\frac{2\pi}{T_0}t} dt = \qquad \text{Eq 11}$$

$$T_s e^{-j\frac{2\pi}{N_0}kn} \int_{-n}^{N_0-n} \operatorname{sinc}(\tau) e^{-j\frac{2\pi}{N_0}k\tau} d\tau = T_s e^{-j\frac{2\pi}{N_0}kn} I_0(k, n)$$

From the above, an analytical expression for the integral can be derived as:

$$I_0(k, n) = \qquad \text{Eq 12}$$

$$\lim_{\epsilon \to 0} \frac{1}{j2\pi} [E_1'(-j\pi(\delta-1)n + \epsilon) - E_1'(-j\pi(\delta-1)(N-n) + \epsilon) -$$

$$E_1'(-j\pi(\delta+1)n + \epsilon) + E_1'(-j\pi(\delta+1)(N-n) + \epsilon)]$$

where $\delta = 2k/N$ and $E_1'(z)$ is a modified version of the exponential integral to treat the singularity at z=0 suitably. An analytical expression for a practical DAC (Zero-order-hold, followed by a reconstruction filter) can be found similarly.

The equation is divided by $T_0 = N_0 T_s$ to match the definition of the continuous time Fourier series coefficient, and the input/output relationship can be written as:
with $$\frac{1}{T_0}\int_0^{T_0} y(t) e^{-j\frac{2\pi}{T_0}kt} dt = \sum_{p,q} c_{pq} CIDFT(f_p(x[n-q])) \qquad \text{Eq 13}$$

$$CIDFT(x[n]) = X_k = \frac{1}{N_0} \sum_{n=-\infty}^{\infty} x[n] e^{-j\frac{2\pi}{N_0}kn} I_0(k, n) \qquad \text{Eq 14}$$

$$X = (F \circ I_0) x$$

The second line shows the transform in vector/matrix notation, where F is an over-complete DFT matrix, $I_0$ is a matrix consisting of the entries $I_0(k,n)$, and $\circ$ is the Hadamard product. The result of the CIDFT matches the continuous time Fourier series coefficients for a hypothetical, periodic signal consisting of samples $x[0], \ldots, x[N_0-1]$.

Figure 4A:
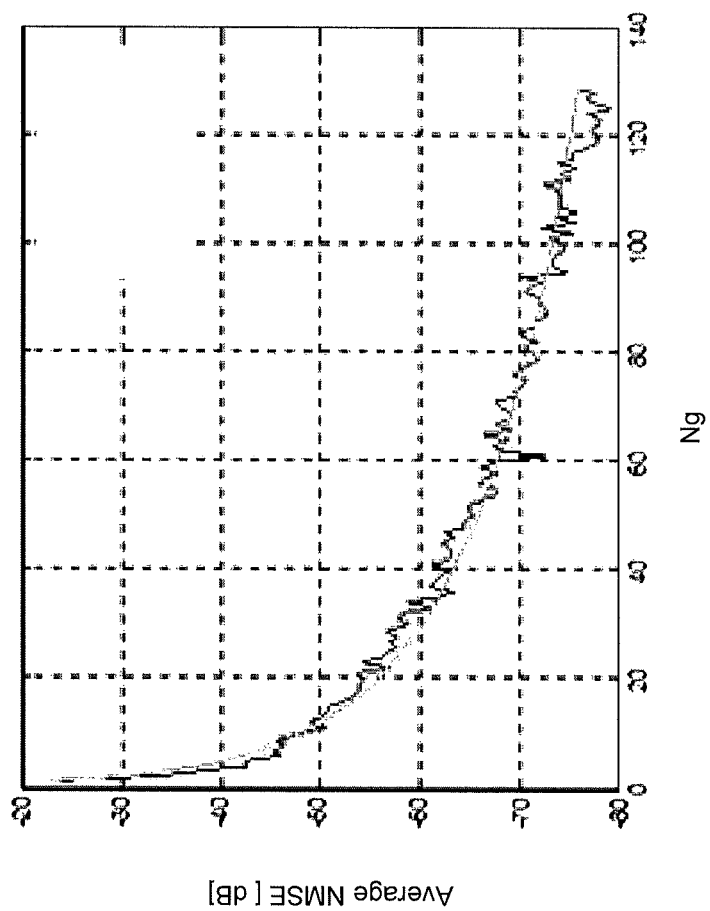
FIG. 4A is an example graph of a number of guard samples used to achieve a predetermined accuracy when using the sinc kernel.

This is similar to the DFT except for the correction matrix $I_0$ and the infinite summation. In various implementations, the sum can be truncated after a finite amount of guard samples $N_g$ while still ensuring suitable accuracy, so the equation reduces to Equation 5 (Eq 5). A typical relationship for the sinc kernel is shown in FIG. 4A for $N_0 = 64$. $N_g$ decreases for higher $N_0$ or practical filters (e.g., Butterworth). For causal interpolation kernels, only $N_g$ preceding samples need to be included, so no buffering of samples is required. As described above, the values of $(F \circ I_0)$ would be calculated during product development and stored in memory.

After $MT_0$ seconds, the system is solved via LS. Compared to the implementation of FIG. 2, the ADC sampling rate is reduced by a factor of $N_0$. Denoting the number of parallel branches by L, the identification time (period necessary to obtain the M pairs of samples) is increased by a factor of $$T = T_{FIG.2} \frac{N_0}{L} \frac{M}{N} \qquad \text{Eq 15}$$

where T is the identification time of FIG. 3, TFIG.2 is the Identification Time of the example of FIG. 2, M and N are the numbers of pairs of samples used, L is the number of branches used in the example of FIG. 3, and No corresponds to the sampling rate reduction (as $f_0=f_s/N_0$) of the ADC 312.

Figure 4B:
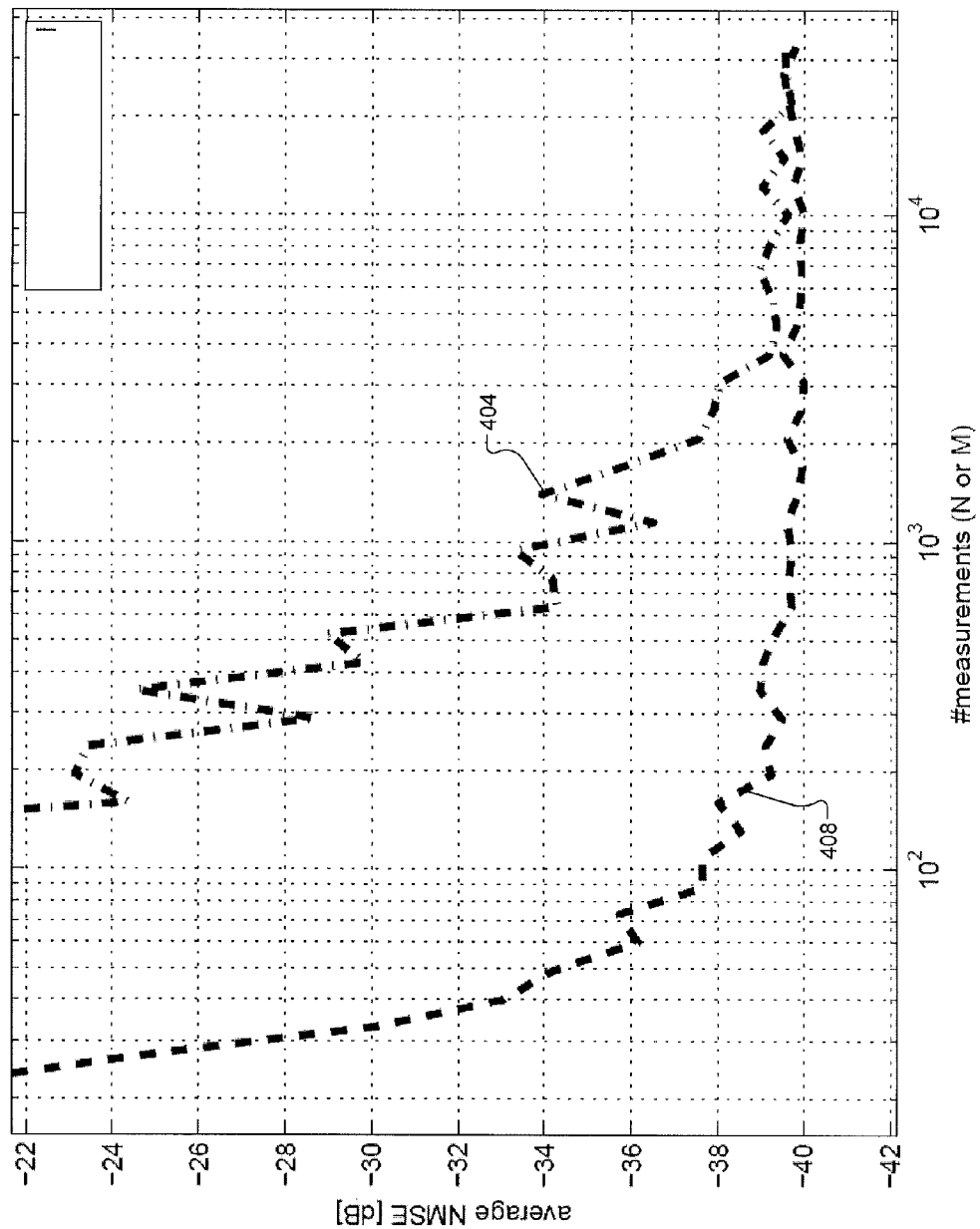
FIG. 4B is an example graph of an average number of measurements used to achieve a predetermined accuracy.

This equation shows that identification time can be traded for sub-Nyquist factor $N_0$, amount of hardware L and is set by the ratio M/N, describing how much fewer measurements are required relative to the example of FIG. 2. As an example, FIG. 4B includes a trace 404 for N and a trace 408 for M for a 46 dBm output power Doherty Power Amplifier with 20 MHz bandwidth and 150 MHz sampling rate. For an accuracy of −38 dB NMSE (M/N≈100/3000), a sub-Nyquist factor may be $N_0=100$. If L=3 and 3 parallel branches are implemented, the systems can be compared as follows:

|  | FIG. 2 | FIG. 3 |
|---|---|---|
| Sampling rate | 2 × 150 MHz | 6 × 1.5 MHz |
| Identification time | 20 us | 22.22 us |
| Avg accuracy (NMSE) | −38 dB | −38 dB |

The number of ADCs is doubled for the example of FIG. 2 because of I/Q modulation. Equivalently, for the example of FIG. 3, the Fourier coefficients are complex numbers and the spectrum is non-redundant.

Figure 5:
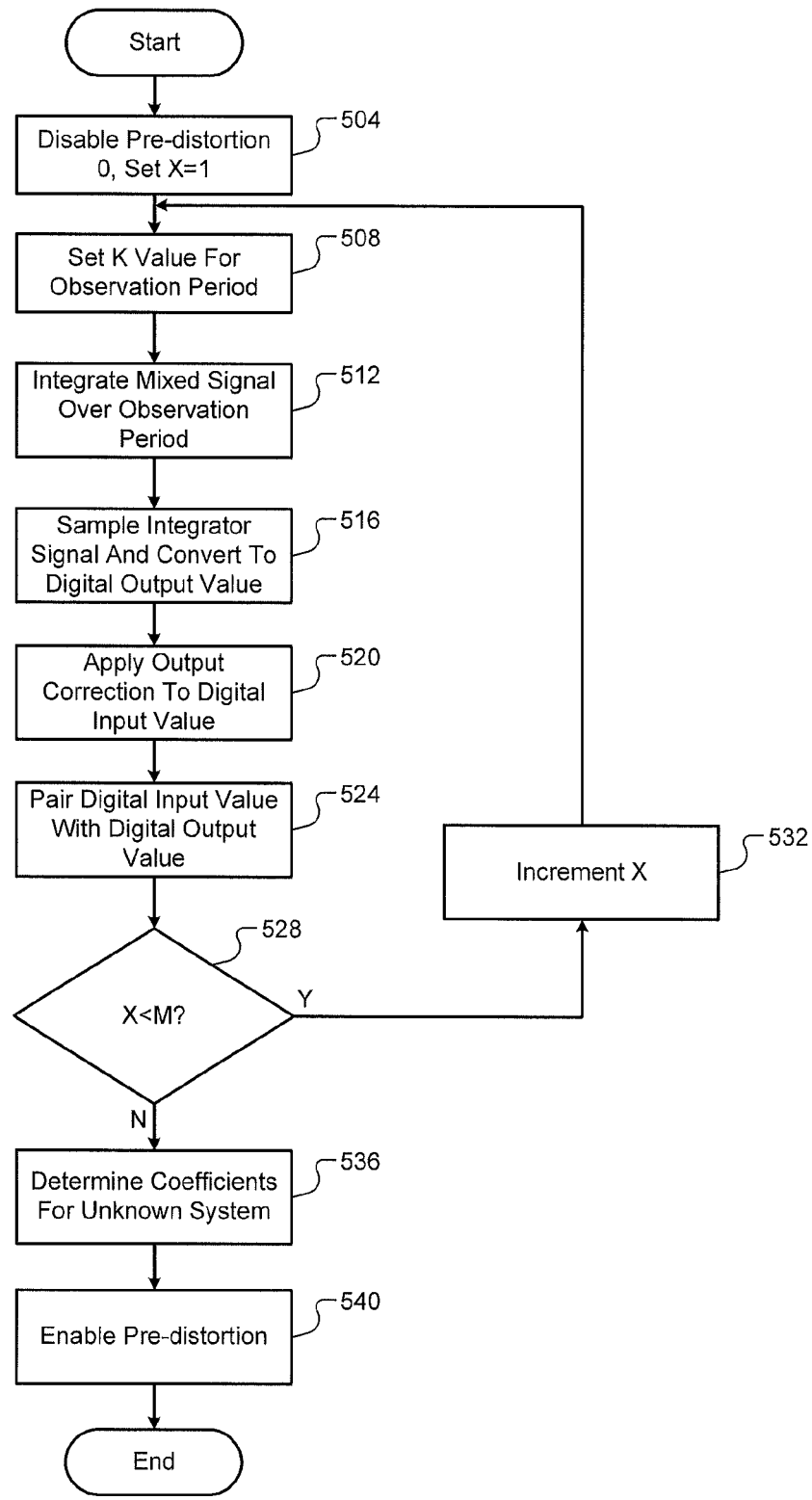
FIG. 5 is a flowchart depicting an example method of determining characteristics for an unknown system.

Referring now to FIG. 5, a flowchart depicting an example method of determining the $c_{pq}$ coefficients for the unknown system 208 is presented. While not shown for purposes of simplicity, the DAC 204 samples the digital input signal and outputs the corresponding analog signal to the unknown system 208 concurrently with the example of FIG. 5. Control begins at 504 where the pre-distortion module 320 disables pre-distortion, and the coefficient determination module 316 sets a counter value X to 1. The counter value X corresponds to the number of pairs of input and output samples.

At 508, the signal generator module 306 sets the k value for the time-varying periodic signal for the observation period. In other words, the signal generator module 306 sets the frequency of the time-varying periodic signal for the observation period (To). The mixer 304 mixes the output of the unknown system 208 with the time-varying periodic signal during the observation period to produce the mixed signal.

At 512, the integrator 308 integrates the mixed signal over the observation period. The ADC 312 converts a sample of the integrator signal over the observation period to a digital output value at 516. At 520, the correction module 324 determines a correction for a digital input sample and the observation period and corrects the digital input sample based on the correction to produce the corrected digital input sample for the observation period.

At 524, the coefficient determination module 316 pairs the corrected digital input sample for the observation period with the digital output value for the observation period. The coefficient determination module 316 determines whether the counter value X is less than the predetermined number of pairs (M) used to determine the $c_{pq}$ coefficients at 528. If 528 is true, the coefficient determination module 316 increments the counter value X at 532, and control returns to 508 for the next observation period. If 528 is false, M pairs of corrected digital input values and the respective digital output values have been collected. The coefficient determination module 316 determines the $c_{pq}$ coefficients for the unknown system 208 at 536 based on the M pairs of values, for example, using least squares. At 540, the pre-distortion module 320 enables pre-distortion and distorts the digital input signal to the DAC 204 based on the $c_{pq}$ coefficients. The unknown system 208 (e.g., the power amplifier 116 of FIG. 1) then operates more accurately.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable, medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including Assembly, C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A characteristic identification system, comprising:
a digital to analog converter (DAC) that samples a first digital signal at a first predetermined rate to produce first digital values and that outputs a first analog signal corresponding to the first digital values to a system of one or more components that is to be characterized;
a mixer that receives a second analog signal output by the system in response to the first analog signal and that mixes the second analog signal with a periodic signal to produce a mixed signal;
an integrator that integrates the mixed signal during successive predetermined periods and that generates an integrator signal based on the integration;
an analog to digital converter (ADC) that samples the integrator signal at a second predetermined rate corresponding to the predetermined periods and that converts the samples into second digital values, wherein the second predetermined rate is less than the first predetermined rate;
a correction module that determines corrections for the integrator and the DAC and that generates third digital values based on the first digital values and the corrections, respectively;
a correction determination module that pairs ones of the third digital values with ones of the second digital values, respectively, and that determines coefficients for the system based on the pairs; and
a pre-distortion module that pre-distorts a second digital signal based on the coefficients for the system to produce the first digital signal.

2. The characteristic identification system of claim 1 wherein the mixer multiplies the second analog signal with the periodic signal to produce the mixed signal.

3. The characteristic identification system of claim 1 wherein the correction determination module determines the coefficients for the system based on the pairs using least squares (LS).

4. The characteristic identification system of claim 1 further comprising a signal generator module that selectively varies a frequency of the periodic signal.

5. The characteristic identification system of claim 4 wherein the signal generator module varies the frequency of the periodic signal within each of the predetermined periods.

6. The characteristic identification system of claim 4 wherein the signal generator module varies the frequency of the periodic signal randomly.

7. The characteristic identification system of claim 4 wherein the signal generator module varies the frequency of the periodic signal based on the first digital values.

8. The characteristic identification system of claim 1 wherein the system includes a non-linear power amplifier.

9. A wireless transmitter comprising:
the characteristic identification system of claim 1, wherein the system includes a non-linear power amplifier;
the non-linear power amplifier; and
an antenna,
wherein the non-linear power amplifier amplifies the first analog signal to produce a third analog signal and applies the third analog signal to the antenna.

10. The characteristic identification system of claim 1 wherein the correction module determines the corrections for the integrator and the DAC based on characteristics of the periodic signal, respectively.

11. A method of characterizing a system of one or more components, comprising:
using a digital to analog converter (DAC), sampling a first digital signal at a first predetermined rate to produce first digital values and outputting a first analog signal corresponding to the first digital values to the system of one or more components that is to be characterized;
using a mixer, receiving a second analog signal output by the system in response to the first analog signal and mixing the second analog signal with a periodic signal to produce a mixed signal;
integrating the mixed signal during successive predetermined periods and generating an integrator signal based on the integrating;

using an analog to digital converter (ADC), sampling the integrator signal at a second predetermined rate corresponding to the predetermined periods and converting the samples into second digital values, wherein the second predetermined rate is less than the first predetermined rate;

determining corrections for the integrator and the DAC;

generating third digital values based on the first digital values and the corrections, respectively;

pairing ones of the third digital values with ones of the second digital values, respectively;

determining coefficients for the system based on the pairs; and pre-distorting a second digital signal based on the coefficients for the system to produce the first digital signal.

12. The method of claim 11 wherein the mixing comprises multiplying the second analog signal with the periodic signal to produce the mixed signal.

13. The method of claim 11 wherein determining the coefficients comprises determining the coefficients for the system based on the pairs using least squares (LS).

14. The method of claim 11 further comprising selectively varying a frequency of the periodic signal.

15. The method of claim 14 further comprising varying the frequency of the periodic signal within each of the predetermined periods.

16. The method of claim 14 further comprising varying the frequency of the periodic signal randomly.

17. The method of claim 14 further comprising varying the frequency of the periodic signal based on the first digital values.

18. The method of claim 11 wherein the system includes a non-linear power amplifier.

19. The method of claim 11 wherein the system includes a non-linear power amplifier that amplifies the first analog signal to produce a third analog signal and applies the third analog signal to an antenna of a wireless transceiver.

20. The method of claim 11 further comprising determining the corrections for the integrator and the DAC based on characteristics of the periodic signal, respectively.

* * * * *